United States Patent
Howard

(10) Patent No.: US 7,514,304 B2
(45) Date of Patent: Apr. 7, 2009

(54) MOSFET HAVING CHANNEL IN BULK SEMICONDUCTOR AND SOURCE/DRAIN ON INSULATOR, AND METHOD OF FABRICATION

(75) Inventor: Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 11/462,406

(22) Filed: Aug. 4, 2006

(65) Prior Publication Data

US 2006/0267061 A1     Nov. 30, 2006

Related U.S. Application Data

(62) Division of application No. 10/868,681, filed on Jun. 14, 2004, now abandoned.

(51) Int. Cl.
    *H01L 21/00*     (2006.01)
(52) U.S. Cl. .................... 438/161; 438/275; 438/296
(58) Field of Classification Search ............... 438/589, 438/221, 222, 424, 430
See application file for complete search history.

(56) References Cited

U.S. PATENT DOCUMENTS

| | | | |
|---|---|---|---|
| 6,274,919 B1 * | 8/2001 | Wada | 257/508 |
| 6,281,082 B1 * | 8/2001 | Chen et al. | 438/296 |
| 6,544,874 B2 * | 4/2003 | Mandelman et al. | 438/589 |
| 6,599,789 B1 * | 7/2003 | Abbott et al. | 438/161 |
| 6,624,045 B2 * | 9/2003 | Liang et al. | 438/430 |
| 7,122,435 B2 * | 10/2006 | Chidambaram et al. | 438/303 |

* cited by examiner

*Primary Examiner*—Thanh V Pham
*Assistant Examiner*—Caleb Henry
(74) *Attorney, Agent, or Firm*—Frederick J. Telecky, Jr.; Wade J. Brady, III

(57) ABSTRACT

A MOSFET device (100) in a mono-crystalline semiconductor material (101) of a first conductivity type, which comprises a source and a drain of the opposite conductivity type, each having regions of polycrystalline semiconductor (110, 120) and respective junctions (112a, 122a) in monocrystalline semiconductor. Localized buried insulator regions (113, 123) are below the polycrystalline source and drain regions, and a gate (130) between the source and drain regions is located so that the gate channel (134) is formed in bulk mono-crystalline semiconductor material. As an example, the semiconductor is silicon, the first conductivity type is p-type, and the localized buried insulator is silicon dioxide. The semiconductor material may also include silicon germanium.

20 Claims, 7 Drawing Sheets

US 7,514,304 B2

MOSFET HAVING CHANNEL IN BULK SEMICONDUCTOR AND SOURCE/DRAIN ON INSULATOR, AND METHOD OF FABRICATION

This is a division of application Ser. No. 10/868,681, filed Jun. 14, 2004.

FIELD OF THE INVENTION

The present invention is related in general to the field of electrical systems and semiconductor devices and more specifically to structure and method of a low-cost MOSFET having low resistance channel region and source/drain on localized insulators.

DESCRIPTION OF THE RELATED ART

The fundamental build block of a microprocessor is the field effect transistor (FET), which acts as a simple switch. The technically preferred variety is the MOSFET based on the metal-oxide-semiconductor technology. The proper voltage applied to the gate electrode induces charge along the channel, which then carries current between the source and the drain, turning the switch on. With sufficiently small gates (about 70 nm channel length and about 1.5 nm gate oxide thickness for the emerging nanotechnology), these transistors can switch on and off billions of times each second.

In order to guide the development in the semiconductor industry through the next decade, models for the key MOSFET physics have been combined with commercial projections and manufacturing needs in the International Technology Roadmap for Semiconductors. For leading-edge logic chips, this Roadmap projects continuous rapid scaling in the physical gate length and gate dielectric equivalent ozide thickness, while the parameter characterizing the performance/speed of the transistor, also called the nMOS delay time constant $\tau$, is projected to improve by its historic rate of about 17%/year. $\tau$ is given as the product of the total gate capacitance per unit width and the power supply voltage, divided by the saturation drive current per unit width. Thus, one way to reduce $\tau$ (or improve performance) is to increase the saturation drive current.

As examples for further goals, a number of applications can benefit from a low source/drain-to-substrate capacitance. For other applications, improved immunity to cosmic radiation faults is desirable.

In addition to the Roadmap, the industry-wide challenge of manufacturing cost-reduction will remain as strong as ever through the next decade. As an example for cost reduction, any process flows, which allow ti eliminate just one photomask or masking step from a series of steps, is considered highly desirable. Further, integrated circuit designs using MOSFETs are helped by incorporating manufacturing steps, which allow self-alignment of source/drain with the polysilicon gate.

SUMMARY OF THE INVENTION

A need has therefore arisen to conceive a fresh concept of a coherent, low-cost methodology for fabricating MOSFETs using fewer photomasks and maintaining self-aligned source/drain in order to produce MOSFETs which combine the advantages of source/drain on oxide with the channel in bulk mono-crystalline semiconductor. Preferably, the MOSFET structure and fabrication method should be based on fundamental design concepts flexible enough to be applied for different semiconductor product families and a wide spectrum of design variations. It should not only meet high electrical (for example, high speed and low source/drain-to-substrate capacitance) and thermal performance requirements, but should also achieve improvements towards the goals of enhanced process yields and device reliability (for instance, immunity to cosmic radiation faults). Preferably, these innovations should be accomplished using the installed equipment base so that no investment in new manufacturing machines is needed.

One embodiment of the invention is a MOSFET device in a mono-crystalline semiconductor material of a first conductivity type, which comprises a source and a drain of the opposite conductivity type, each having regions of polycrystalline semiconductor and respective junctions in monocrystalline semiconductor. Localized buried insulator regions are below the polycrystalline source and drain regions, and a gate between the source and drain regions is located so that the gate channel is formed in bulk mono-crystalline semiconductor material. As an example, the semiconductor is silicon, the first conductivity type is p-type, and the localized buried insulator is silicon dioxide. The semiconductor material may also include silicon germanium.

Another embodiment of the invention employs an initial shallow trench isolation step as a means of confining the MOSFET to a predetermined region. In another embodiment, the drain features an extended junction.

Another embodiment of the invention is a method for fabricating an MOS field effect transistor device in the surface of a semiconductor material of a first conductivity type. The method comprises the steps of forming a pair of sub-surface localized insulator regions, and forming source and drain regions comprising poly-crystalline semiconductor regions above the insulator regions, respectively. Finally, and a gate region at the surface between the source and drain regions is formed so that the gate channel operates in bulk monocrystalline semiconductor material. Innovative process steps employed by the method include anisotropic etching, chemical-mechanical polishing and the formation of a silicon carbide layer as a stopper for chemical-mechanical polishing. The method of the invention needs one photomask less than the conventional process flow, and is thus less expensive.

The MOSFET created by the method of the invention has fewer parasitics and is, therefore, a faster transistor. It allows scaling of gate length and gate insulator thickness.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 2 shows schematically the process steps of forming a layer of a first insulating material, of polycrystalline semiconductor, and of silicon carbide.

FIG. 3 shows schematically the process steps of forming a pair of trenches and the region intended for the gate channel.

FIG. 4 shows schematically the process step of depositing a second insulating material.

FIG. 5 shows schematically the process step of applying chemical-mechanical polishing.

FIG. 6 shows schematically the process step of anisotropically etching the second insulating material.

FIG. 7 shows schematically the process steps of forming, chemically-mechanically polishing, etching, and partially oxidizing polycrystalline semiconductor material.

FIG. 8 shows schematically the process steps of protecting the intended gate and source/drain regions and removing unprotected polycrystalline and insulating materials.

FIG. 9 shows schematically the process steps of forming the gate sidewalls.

FIG. 10 shows schematically the process steps of forming the source and drain junctions.

DETAILED DESCRIPTION OF THE PREFERRED EMBODIMENTS

Figure 1:
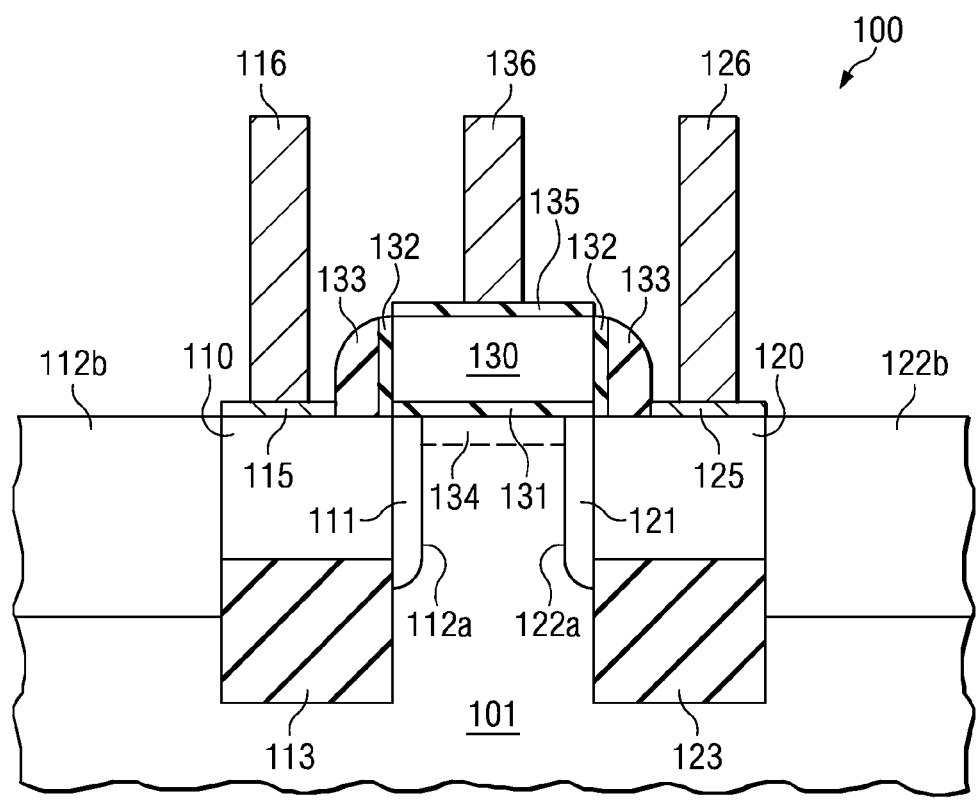
FIG. 1 is a schematic cross section of a portion of a semiconductor wafer depicting an MOS field effect transistor device according to an embodiment of the invention.

FIG. 1 illustrates a schematic cross section of a portion of a semiconductor wafer 101 depicting an MOS field effect transistor (MOSFET) device, generally designated 100, according to an embodiment of the present invention. The semiconductor wafer is monocrystalline and has a first conductivity type. Preferably, the wafer is made of silicon and the conductivity is p-type; the considerations of this invention, however, also apply to n-type semiconductor bulk material. Other embodiments include silicon germanium or gallium arsenide or any other semiconductor material used for device production.

Device 100 has a source of the opposite conductivity type, comprising a region 110 made of polycrystalline semiconductor and a region 111 made of monocrystalline semiconductor, delineated by junction 112a from the monocrystalline bulk 101 in the intended gate region (the other part of the source/bulk junction is designated 112b).

Device 100 further has a drain of the opposite conductivity type, comprising a region 120 made of polycrystalline semiconductor and a region 121 made of monocrystalline semiconductor, delineated by junction 122a from the monocrystalline bulk 101 in the intended gate region (the other part of the drain/bulk junction is designated 122b).

As FIG. 1 shows, a localized buried insulator region 113 is below the polycrystalline source region 110, and a localized buried insulator region 123 is below the polycrystalline drain region 120. These structural features render source and drain of device 100 "on insulator". A preferred choice of these insulators is the oxide of the respective semiconductor 101; thus, when bulk 101 is made of silicon, the preferred insulator choice 113 and 123 is silicon dioxide.

Device 100 further has a gate comprising a conductor region 130 (preferably polycrystalline semiconductor), an insulator layer 131 (preferably thermally grown semiconductor insulator such as silicon dioxide), side insulator layers 132 (preferably silicon dioxide), and sidewalls 133 (preferably silicon nitride). The gate is between source and drain located so that the gate channel 134 is formed in bulk monocrystalline semiconductor material 101. The length of channel 134 may be as short as about 15 nm, and the thickness of the insulator layer 131 as thin as about 1.5 nm.

In order to provide contacts to source 110, gate 130, and drain 120, FIG. 1 indicates metal-semiconductor layers 115, 135, and 125, respectively, (preferably metal silicides), and contact metals 116, 136, and 126, respectively.

The structure of MOSFET 100 combines the localized source-on-insulator and drain-on-insulator, and thus the low source/drain-to-substrate capacitance and the immunity to cosmic radiation faults, with the speed of a channel in bulk semiconductor. MOSFET 100 is scalable with regard to physical gate length and gate dielectric equivalent oxide thickness. The embodiment of the invention depicted in FIG. 1 is thus well positioned to improve the delay time constant $\tau$, given as the product of the total gate capacitance per unit gate width and the power supply voltage, divided by the saturation drive current per unit width.

The embodiment of FIG. 1 can be manufactured by a low-cost process flow, which operates with one less photomask compared to standard process, while is maintains features such as self-aligned source/drain with poly gate. The innovative process flow includes well-controllable process techniques such as deposition of silicon carbide and chemical-mechanical polishing. According to the invention, the method for fabricating a MOSFET in the surface of a semiconductor material of a first conductivity type comprises the steps of forming a pair of sub-surface localized insulator regions; forming source and drain regions comprising polycrystalline semiconductor regions above the insulator regions, respectively; and forming a gate region at the surface between the source and drain regions so that the gate channel is formed in bulk monocrystalline semiconductor material.

In more detail, the method for fabricating a MOSFET in a semiconductor material of a first conductivity type is described by the process steps of FIGS. 2 to 10.

Figure 2:
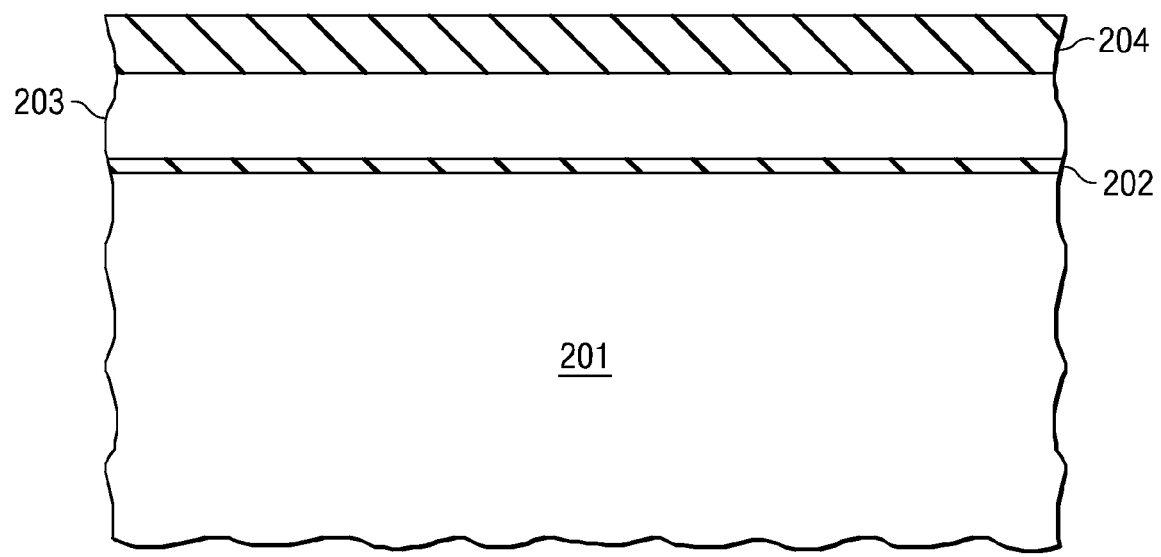
FIGS. 2 to 10 are schematic cross sections of a portion of a semiconductor wafer illustrating another embodiment of the invention, a method for fabricating an MOS field effect transistor having its channel in bulk semiconductor and its source and drain on insulator.

In the schematic cross section of FIG. 2, the process starts by growing a layer 202 of first insulating material on the surface of a wafer of semiconductor material 201. The semiconductor is preferably silicon, and the conductivity is preferably p-type. Other alternatives are materials, which include silicon germanium, gallium arsenide, or other semiconductor materials, and all considerations hold for n-type conductivity, just with a reversal of all conductivity considerations. The layer 202 of first insulating material is preferably thermally grown silicon dioxide in the thickness range from about 3 to 10 nm; the thickness, however, may be as thin as 1 nm, and other insulating compounds are acceptable, as long as they are able to serve as gate insulator layers, including the required stability and interface state characteristics.

In the next process step, a polycrystalline semiconductor layer 203 is deposited on insulating layer 202 on the wafer. Preferably, the polycrystalline material is poly-silicon; the preferred layer thickness is between about 200 and 400 nm. Other conductors are acceptable as long as they can serve as gate conductors.

A layer 204 of silicon carbide is then deposited on the polycrystalline semiconductor layer 203 on the wafer. This layer is intended to act as a barrier in a chemical-mechanical polishing process step and has thus a preferred thickness in the range from 200 to 300 nm.

Figure 3:
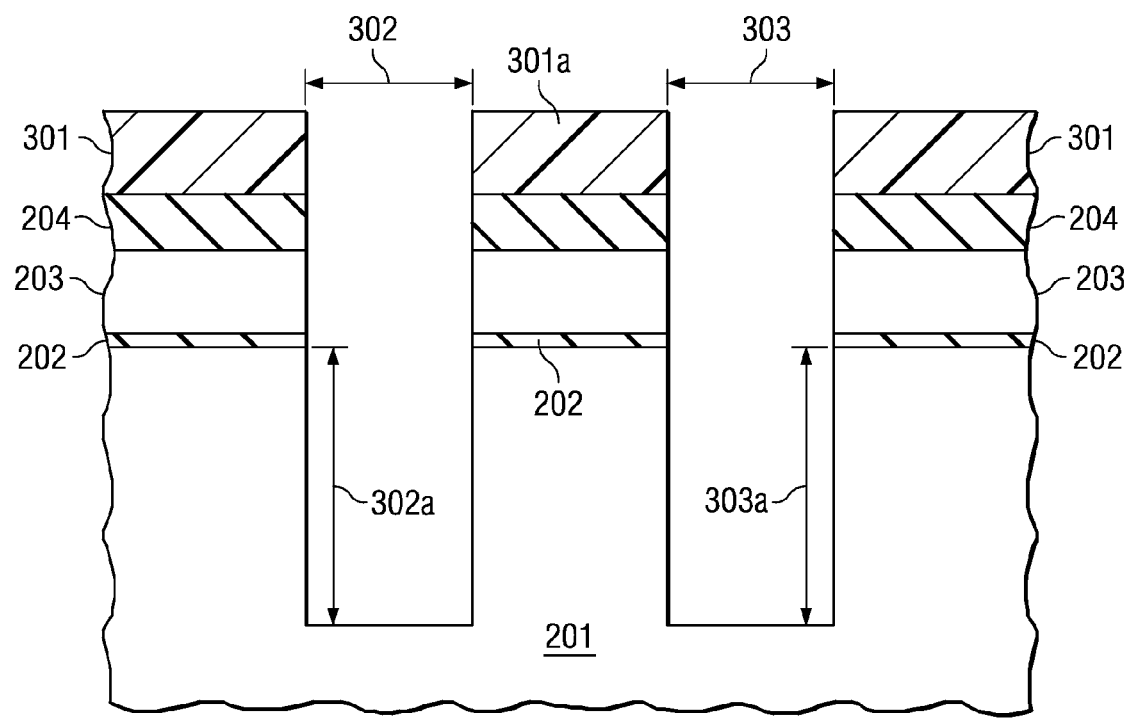

The next process steps define the regions, which are intended to become the source and drain regions of the MOSFET with the gate region between them; these steps are depicted in the schematic cross section of FIG. 3. A first photoresist layer 301 is deposited on silicon carbide layer 204. The photoresist layer is then masked, developed, and etched. One of the remaining photoresist portions, 301a, protects the region to become the transistor gate of the MOSFET. In the stretches 302 and 303, which are to become the source and drain regions of the MOSFET, respectively, the photoresist portions are removed. In subsequent etching steps, the newly exposed layer portions of silicon carbide, polysilicon, and first insulator are sequentially removed, each one by its appropriate etching medium.

As FIG. 3 further indicates, in the intended source and drain regions 302 and 303, the underlying semiconductor 201 is etched to create, respectively, a trench 302a and 303a of predetermined depth. The preferred range for the depth of the trenches is between 400 and 600 nm. After these etch steps, the remaining portions of the first photoresist layer are removed.

Figure 4:
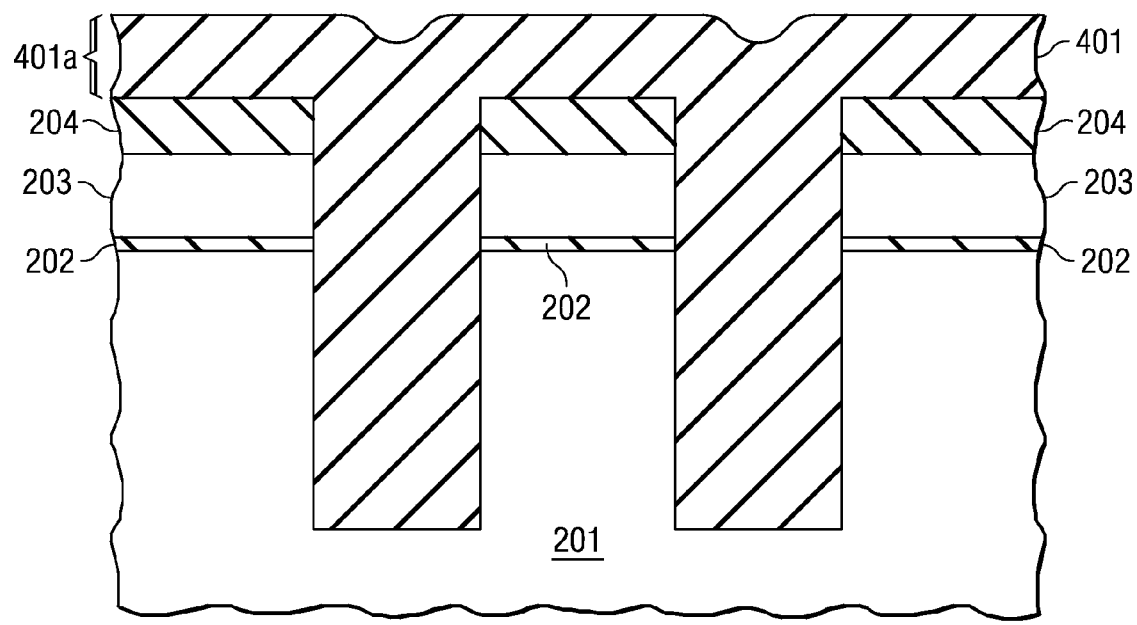

In the next process step, indicated in the schematic cross section of FIG. 4, a second insulating material 401 is deposited so that it fills the trenches and in addition forms a continuous layer of thickness 401a (for example, about 200 nm thick) on the surface of the wafer, including the top surface of the remaining silicon carbide layer 204. The preferred choice for the second insulating material is silicon dioxide (deposited, not thermally grown like the first insulating material); alternatively, it may be another insulating compound of silicon.

Although not shown in FIG. 4, it is advisable to anneal the damage done by the etch step in FIG. 3 by thermally growing an oxide layer of less than about 10 nm, before the second insulating material 401 is deposited.

Figure 5:
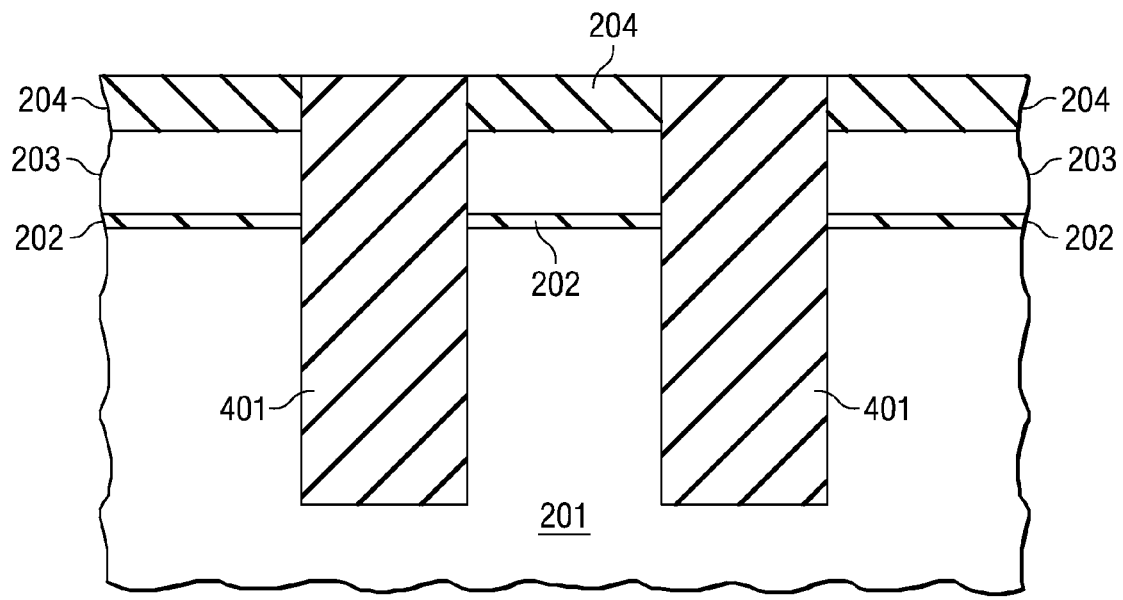

The schematic cross section of FIG. 5 illustrates the result of the next process step, which employs chemical-mechanical polishing. The continuous layer 401a of the second insulating material is removed by the technique of chemical-mechanical polishing; the polishing process is stopped by the underlying silicon carbide material 204, which acts as a barrier against further chemical-mechanical polishing.

Figure 6:
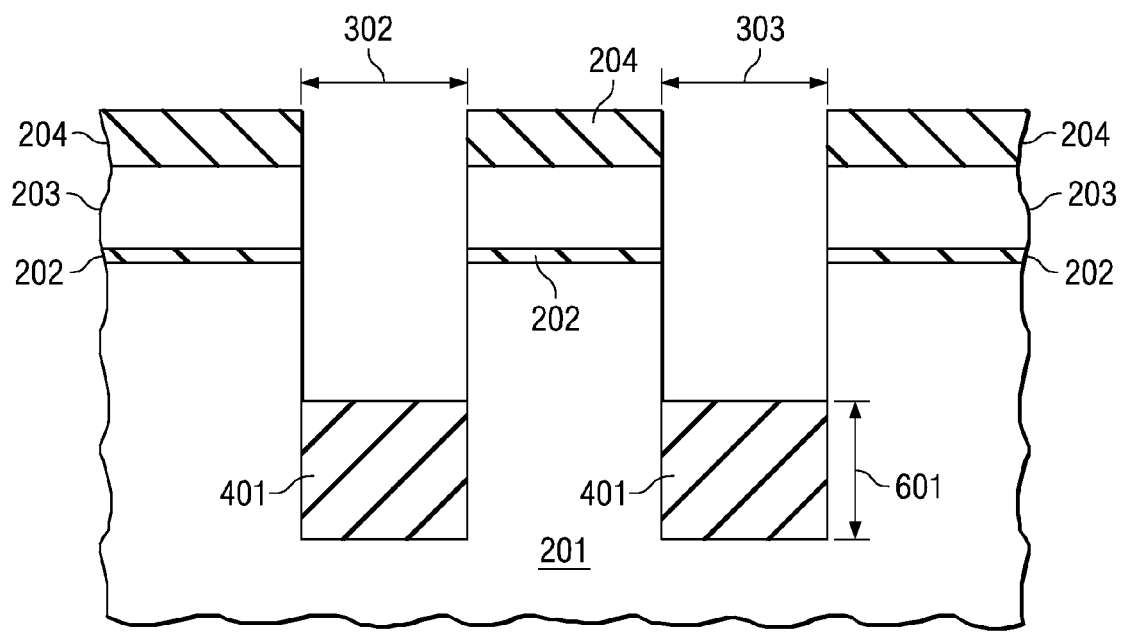

As FIG. 6 indicates, an anisotropic etch is employed to etch the second insulating material 401 in the trenches 302 and 303. The etch process continues until only a pre-determined thickness 601 of the second insulating material 401 remains in the trenches 302 and 303. Thickness 601 is preferably between about 200 and 400 nm. The anisotropic etch comprises, for instance, reactive ion etching, preferably using flourine gas.

Although not shown in FIG. 6, it is advisable to follow, after the anisotropic etch step, with a process of annealing the etch damage. This process includes a clean-up step, followed by a thermal oxidation step to grow an oxide layer of less than about 10 nm thickness; this thermal oxide is then removed by an etch step involving low concentration hydrofluouric acid.

Figure 7:
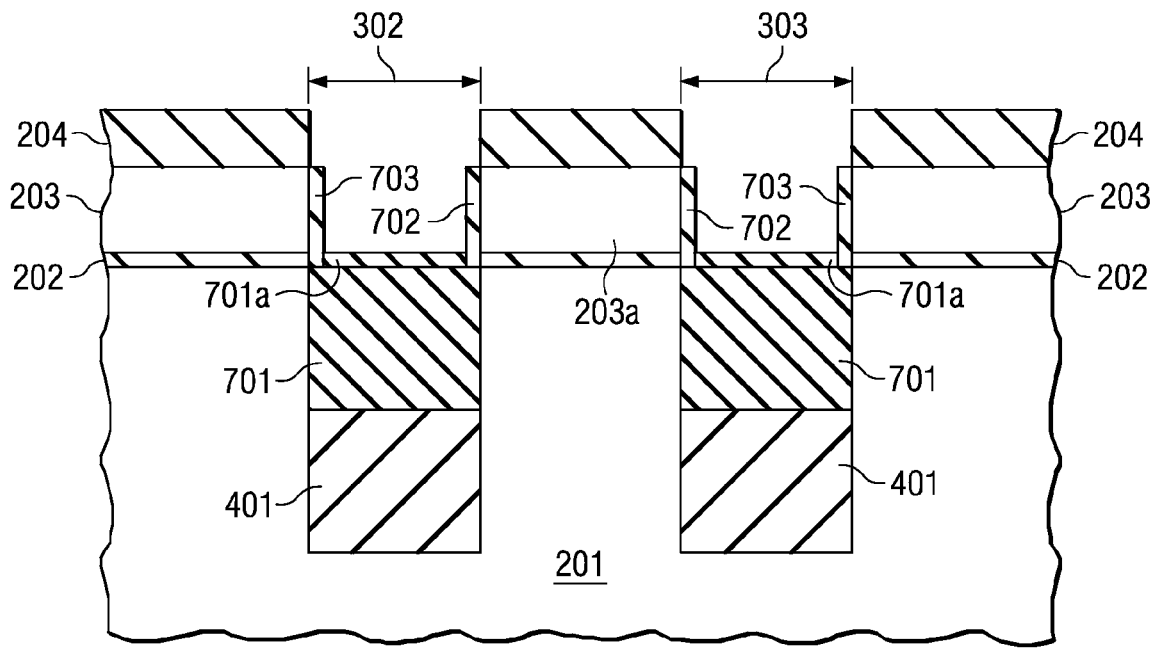

In the next process steps, indicated in FIG. 7, polycrystalline semiconductor material is first deposited into the trenches 302 and 303 until they are filled with this polycrystalline semiconductor material and an additional layer of poly-material is deposited on the wafer surface. Preferably, the polycrystalline semiconductor material is polysilicon. Chemical-mechanical polishing is then applied to polish sway the poly-material on the surface, until the silicon carbide stopper 204 is reached. Next, the polycrystalline material is anisotropically etched into trenches 302 and 303 to a depth just below the first insulating layer 202. The remaining poly-material is designated in FIG. 7 by 701. The thickness of the polycrystalline material 701 in the trenches depends, of course, on the amount of trench 302 and 303 which was to be filled; as an example, it may be approximately 200 nm thick. Finally, the exposed surfaces of the polycrystalline material are thermally oxidized. This insulating surface layer is often referred to as "liner oxide"; it has preferably a thickness between about 3 and 10 nm. In FIG. 7, the trench fillings 701 grow liner oxides 701a on their exposed surfaces; the polycrystalline material portions 203 grow liner oxides 703 on their exposed side walls; and the polycrystalline portion 203a grows line oxides 702 around all exposed side walls.

Figure 8:
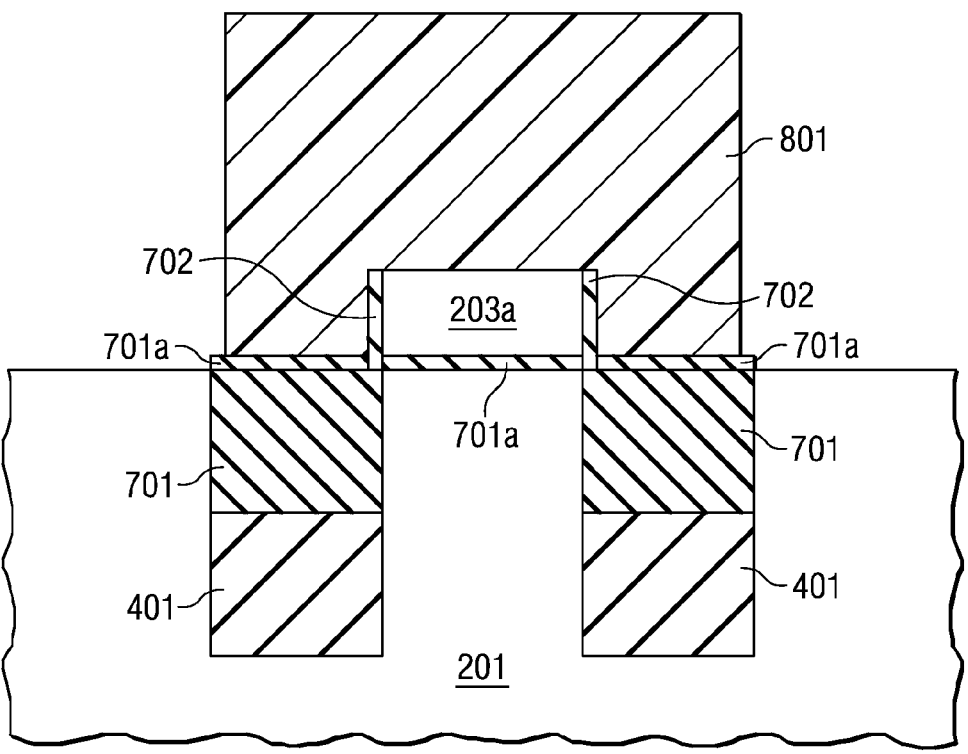
Figure 9:
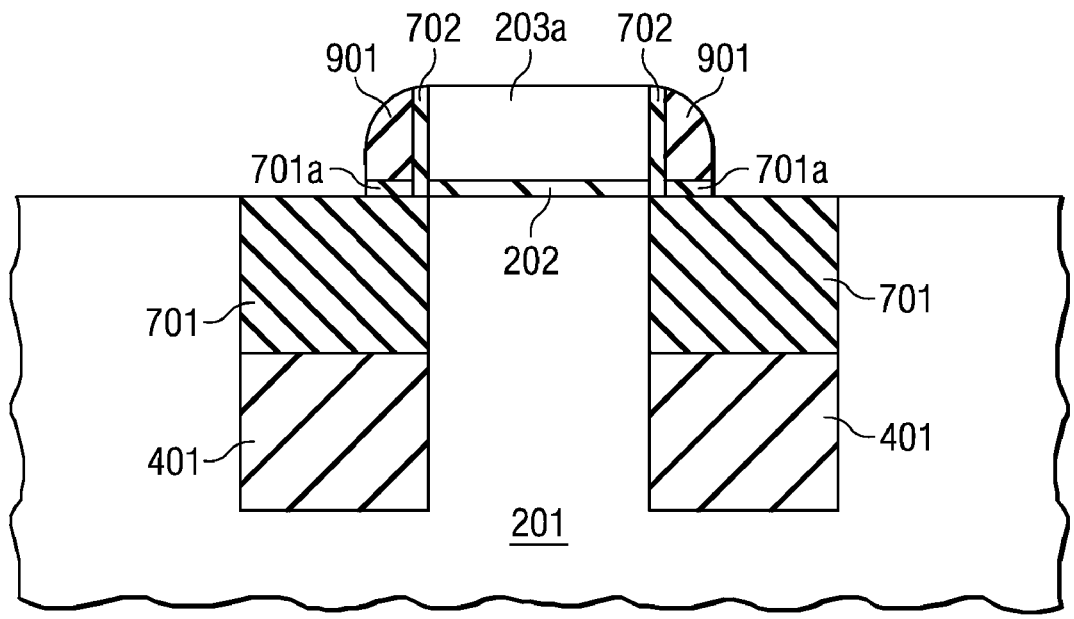

FIG. 8 summarizes the next process steps. The remaining portions of the silicon carbide layer 204 are removed by etching. A second photoresist layer is deposited, masked and developed; the remaining portion 801 of this second photoresist layer protects the regions of the intended gate, including the polycrystalline semiconductor 203a and the liner oxides 702, and the trenches covered by the liner oxides 701a. Thereafter, the exposed layers of the polycrystalline semiconductor material 203 and the first insulating material 202 are etched away. The remaining portion 801 of the second photoresist layer is removed.

Next, a silicon nitride layer, preferably between 200 and 400 nm thick, is deposited over the wafer. As shown in the schematic cross section of FIG. 9, the nitride layer is etched so that only sidewalls 901 of silicon nitride remain around the oxidized sides 702 of the intended gate polycrystalline semiconductor material 203a. Furthermore, the now exposed portions of the liner oxide 701a over the polycrystalline regions 701 are etched and only the liner oxide portions covered by silicon nitride 901 remain.

Figure 10:
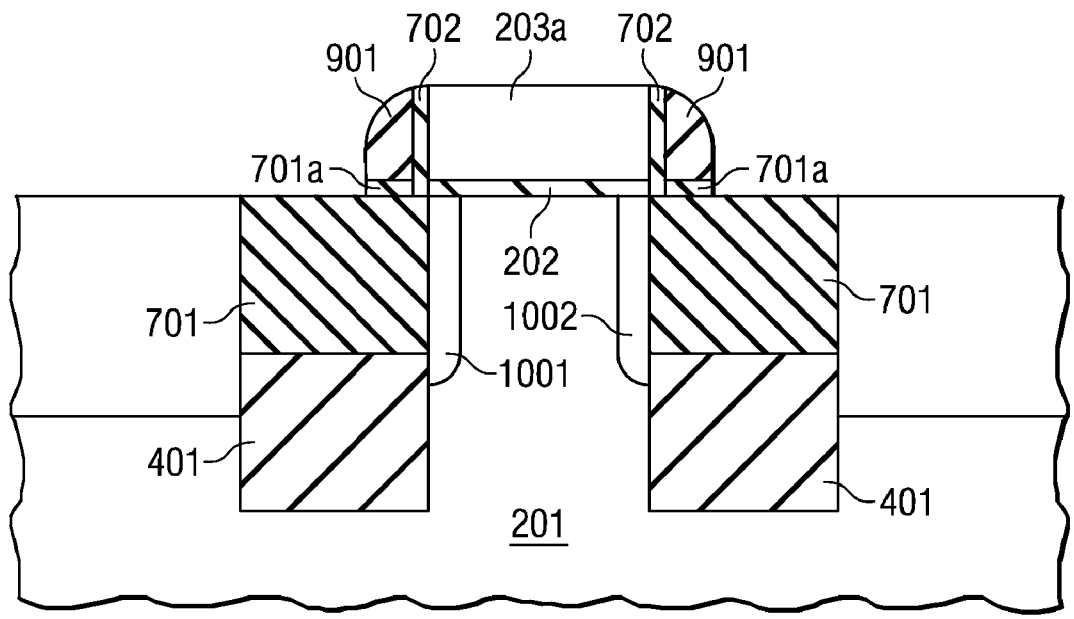

FIG. 10 illustrates the formation of the source and drain junctions 1001 and 1002, respectively, of the MOSFET. For this self-aligned process step, dopants of the opposite conductivity type are implanted at high dose and high energy and annealed so that junctions for source and drain are formed under the layer 202 of the first insulating material under said intended gate 203a; the preferred junction depth is approximately 100 nm. As an example of preferred implantation conditions, the step of implanting uses phosphorus at a dose of about 1e14 to 1e15/cm$^2$ and about 50 keV energy, when the semiconductor of the first conductivity type is p-type silicon; the step uses boron at a dose of about 1e14 to 1e15/cm$^2$ and about 20 keV energy for n-type silicon.

The finished MOSFET has been described above in FIG. 1, using designations different from the ones employed for the steps of the process flow on FIGS. 2 to 10. As shown in FIG. 1, the process steps leading to MOSFET completion include forming metal-semiconductor layers 115, 125, and 135 in contact with polycrystalline semiconductor regions 110, 120, and 130 respectively, of the intended source, drain and gate; further the step of forming metal contacts 116, 126, and 136 to the respective metal-semiconductor layers.

Figure 11:
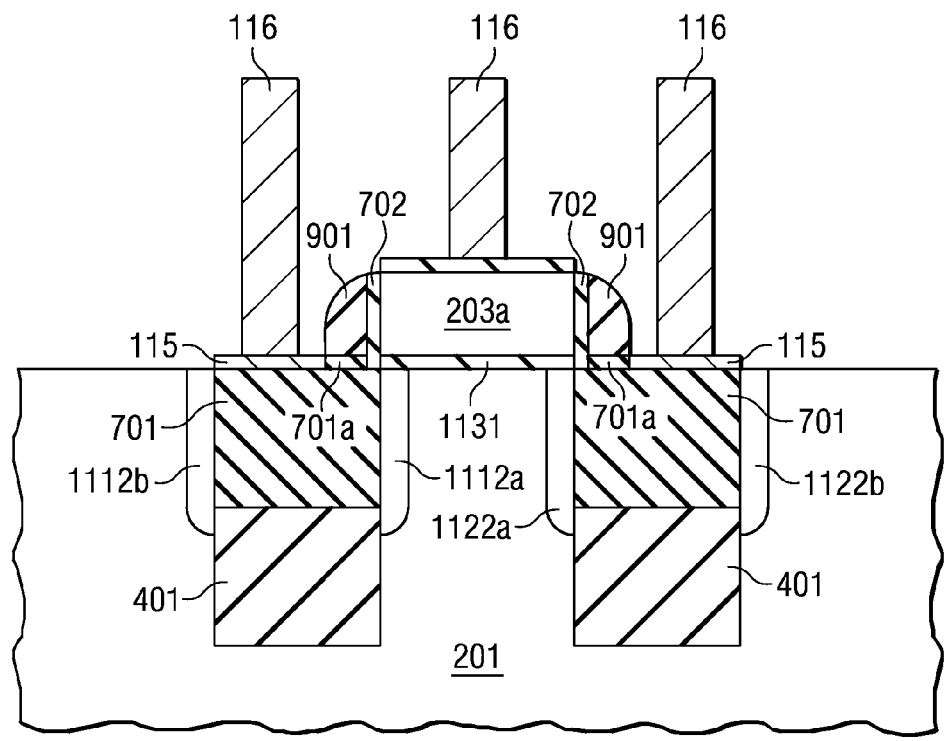
FIG. 11 is a schematic cross section of a portion of a semiconductor wafer depicting an MOS field effect transistor having symmetrical planar source and drain junctions according to another embodiment of the invention.

Another embodiment of the invention is depicted in FIG. 11, where the source and drain junctions intersect with the surface in planar technology; an extra masking step is needed for this embodiment. Not only junction portions 1112a and 1122a reach the surface (under the gate insulator 1131), but also junction portions 1112b and 1122b terminate at the surface.

Figure 12:
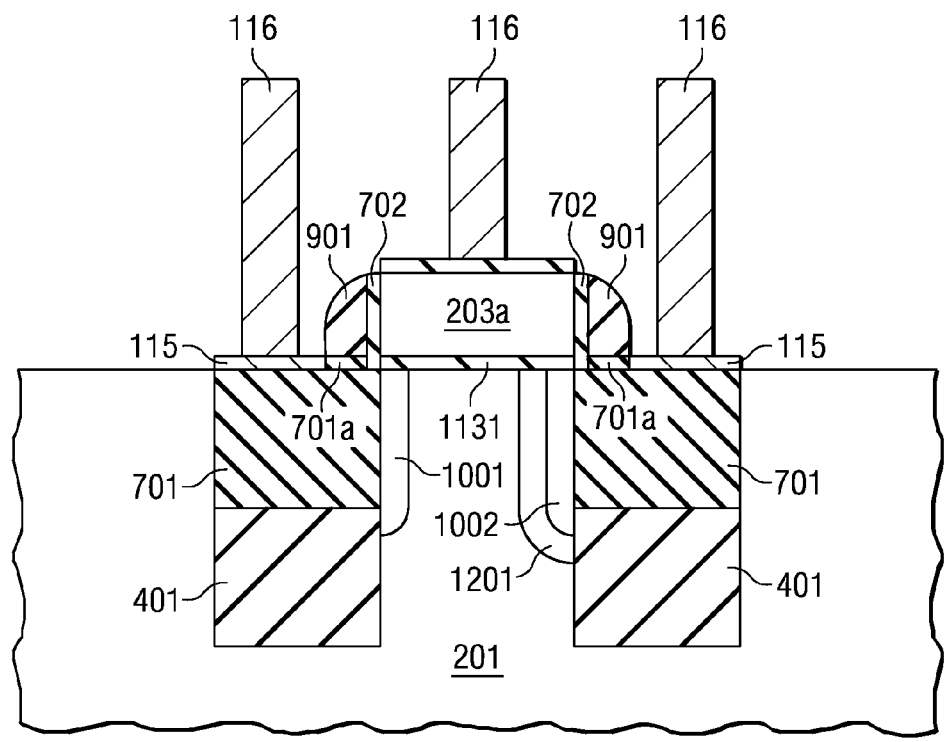
FIG. 12 is a schematic cross section of a portion of a semiconductor wafer depicting an MOS field effect transistor device having an extended drain junction according to another embodiment of the invention.

Another embodiment of the invention is illustrated in FIG. 12. An extended drain doping has been added in order to provide a space charge layer 1201 for higher device breakdown voltage. The process creating this extended drain junction comprises, before the step of implanting dopants for source and drain, the step of implanting dopants of the conductivity type opposite to the conductivity type of the starting semiconductor, at low dose and low energy, and annealing this implant so that an extended junction for a drain of higher breakdown voltage is formed under the first insulating material under the intended gate. A preferred example for this extended junction implant uses a dose of approximately 1e12 to 1e14/cm$^2$ depending upon the final required doping density for the extended region 1201.

Figure 13:
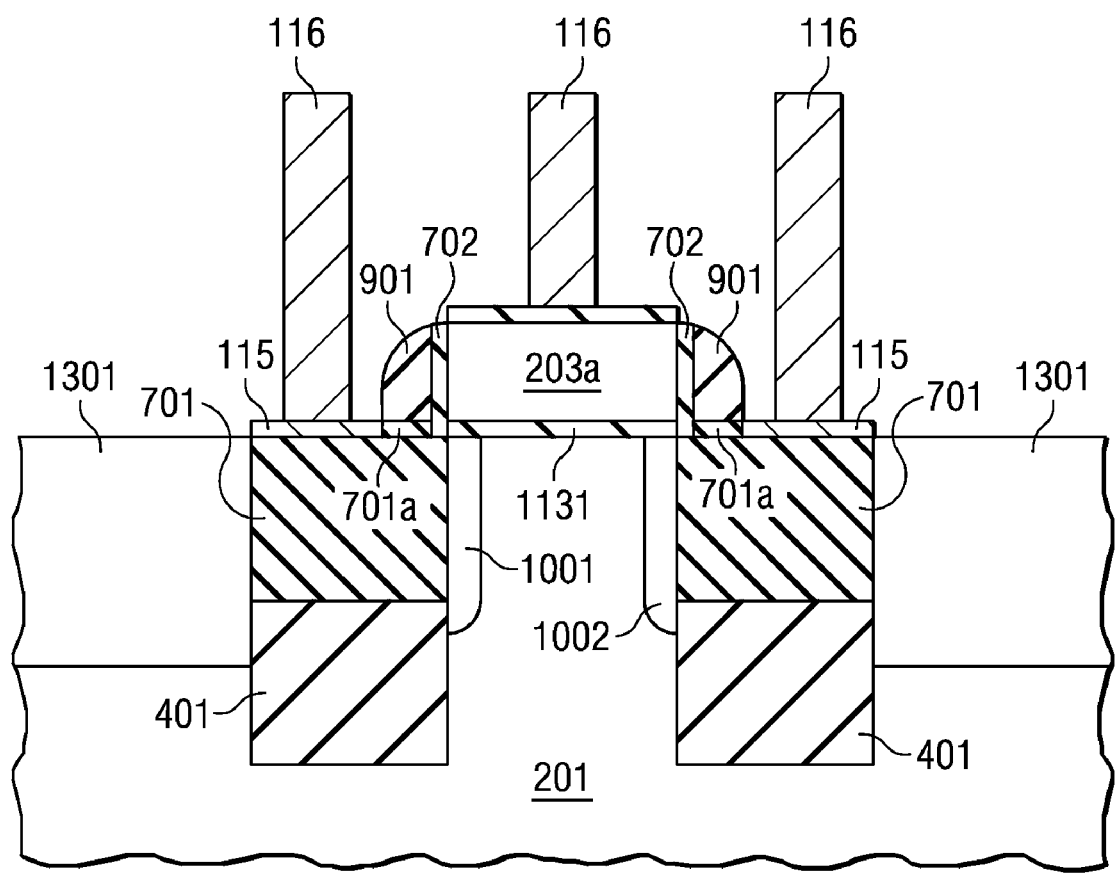
FIG. 13 is a schematic cross section of a portion of a semiconductor wafer depicting an MOS field effect transistor device between shallow trench isolation, according to another embodiment of the invention.

FIG. 13 shows another embodiment of the invention wherein the MOSFET is confined between shallow trench isolations 1301. There are two convenient possibilities in the fabrication process flow discussed above to create the trench isolations. One possibility is before the step of growing the layer of the first insulating material. Portions of the starting semiconductor material of the first conductivity type are removed and isolation material is deposited so that the region between these portions defines the region of the transistor-to-be-fabricated.

Another possibility is before the step of removing the second photoresist layer. The semiconductor material is etched and isolation material is deposited adjacent to each trench so that the intended MOSFET is confined between this isolation material.

While this invention has been described in reference to illustrative embodiments, this description is not intended to be construed in a limiting sense. Various modifications and combinations of the illustrative embodiments, as well as other embodiments of the invention, will be apparent to person skilled in the art upon reference to the description. As an example, the material of the MOSFET may comprise silicon, silicon germanium, gallium arsenide, or any other semiconductor or compound material used in IC manufacturing. As another example, the conductivity of the starting semiconductor material may be p-type, or it may n-type. As other examples, a variety of etching procedures can be used for the material removal steps discussed in the MOSFET fabrication process flow. It is therefore intended that the appended claims encompass any such modifications or embodiments.

I claim:

1. A method for fabricating an MOS field effect transistor device in the surface of a semiconductor material of a first conductivity type, comprising the steps of:

growing a layer of first insulating material on said surface of said semiconductor material;

depositing a polycrystalline semiconductor layer on said insulating layer;

depositing a silicon carbide layer on said polycrystalline semiconductor layer;

depositing, masking, and developing a first photoresist layer to define the regions intended for channel, source contact, and drain contact of said MOSFET device, wherein the first photoresist layer is deposited on the silicon carbide layer;

protecting said intended channel region, while etching, in the regions of said intended source and drain contacts, sequentially said layers of photoresist, of silicon carbide, of polycrystalline semiconductor, and of first insulator;

in said intended source and drain contact regions, etching the underlying semiconductor to create, respectively, a trench of predetermined depth; removing the remaining portion of said first photoresist layer;

depositing a second insulating material so that it fills said trenches and forms a continuous layer on top of the remaining silicon carbide layer;

chemical-mechanical polishing said continuous layer of second insulating material until said continuous layer is removed and the underlying silicon carbide material is exposed, which acts as a barrier against further chemical-mechanical polishing;

etching anisotropically said second insulating material in said trenches until only a predetermined thickness of said second insulating material remains in said trenches;

depositing polycrystalline semiconductor material into said trenches until they are filled with said polycrystalline semiconductor material;

chemical-mechanical polishing any excess deposition of said polycrystalline semiconductor material, until the barrier of said silicon carbide layer is reached;

etching anisotropically said polycrystalline semiconductor material in said trenches to the depth of said first insulating material;

oxidizing the exposed surfaces of said polycrystalline semiconductor material, including the exposed surfaces of the intended gate polycrystalline semiconductor material, to form an liner oxide surface layer;

etching said silicon carbide layer;

depositing, masking and developing a second photoresist layer to protect the regions of said intended gate and said trenches;

etching the exposed layers of said polycrystalline semiconductor material and first insulating material;

removing said second photoresist layer;

depositing a layer of silicon nitride;

etching said nitride layer so that sidewalls remain around the oxidized sides of the intended gate polycrystalline semiconductor material;

etching the layer of said first insulating material remaining on said trenches; and implanting dopants of the opposite conductivity type at high dose and high energy, and annealing said implant so that junctions for source and drain are formed under said first insulating material under said intended gate.

2. The method according to claim 1 wherein said semiconductor material is silicon.

3. The method according to claim 1 wherein said first conductivity type is p-type.

4. The method according to claim 1 wherein said first insulating material is an oxide, including silicon dioxide, thermally grown to a layer thickness between about 1.5 to 10 nm.

5. The method according to claim 1 wherein said polycrystalline semiconductor material is polycrystalline silicon and said layer has a thickness between about 200 to 400 nm, said polycrystalline silicon operable as the gate polycrystalline material.

6. The method according to claim 1 wherein said silicon carbide layer has a thickness between about 200 to 300 nm, said silicon carbide operable as a barrier to the chemical-mechanical polishing process.

7. The method according to claim 1 wherein said predetermined depth for trenches is between about 400 to 600 nm.

8. The method according to claim 1 wherein said second insulating material is silicon dioxide.

9. The method according to claim 1 wherein said anisotropic etch comprises reactive ion etching.

10. The method according to claim 1 wherein said predetermined thickness is about 200 to 400 nm.

11. The method according to claim 1 wherein said step of oxidizing said polycrystalline semiconductor material comprises thermal oxidation and forms an insulating surface layer having a thickness of about 1.5 to 10 nm.

12. The method according to claim 1 wherein said silicon nitride layer has a thickness between about 200 to 400 nm.

13. The method according to claim 1 wherein said step of implanting uses phosphorus at a dose of about 1e14 to 1e15/cm.sup.2 and about 50 keV energy for said semiconductor of said first conductivity type being p-type; the step uses boron at a dose of about 1e14 to 1e15/cm.sup.2 and about 20 keV energy for n-type semiconductor.

14. The method according to claim 1 further comprising, before the step of removing said second photoresist layer, the steps of etching said semiconductor material and depositing isolation material adjacent to each trench so that said intended transistor is confined between said isolation material.

15. The method according to claim 1 further comprising the steps of:
forming metal-semiconductor layers in contact with said polycrystalline semiconductor regions of said intended source, drain and gate; and
forming metal contacts to said metal-semiconductor layers.

16. The method according to claim 1 further comprising, before said step of growing said layer of said first insulating material, the steps of removing portions of said semiconductor material of said first conductivity type and depositing isolation material so that the region between said portions defines the region of the transistor-to-be-fabricated.

17. The method according to claim 1 further comprising, before said step of implanting dopants for said source and drain, the step of implanting dopants of the opposite conductivity type at low dose and low energy, and annealing said implant so that an extended junction for a drain of higher breakdown voltage is formed under said first insulating material under said intende gate.

18. The method according to claim 17 wherein said implant dose for said extended junction is approximately 1e12 to 1e14/cm.sup.2 depending upon the final required doping density for the extended region.

19. The method according to claim 1 further comprising, before said step of depositing a second insulating material, the step of thermally growing an oxide layer of less than about 10 nm thickness.

20. The method according to claim 1 further comprising, after said step of etching said second insulating material, the step of thermally growing an oxide layer of less than about 10 nm thickness and of chemically removing said thermal oxide layer.

* * * * *